United States Patent
Ahmed et al.

(10) Patent No.: US 7,386,779 B2
(45) Date of Patent: Jun. 10, 2008

(54) SYSTEMS AND METHODS FOR CORRECTING ERRORS IN A RECEIVED FRAME

(75) Inventors: Walid Ahmed, Eatontown, NJ (US); Juan G. Gonzalez, Wilmington, DE (US); Salim Manji, South Plainfield, NJ (US); Jose Luis Paredes, Merida (VE)

(73) Assignee: Lucent Technologies, Murray Hill, NJ (US)

( * ) Notice: Subject to any disclaimer, the term of this patent is extended or adjusted under 35 U.S.C. 154(b) by 1086 days.

(21) Appl. No.: 10/159,523

(22) Filed: May 31, 2002

(65) Prior Publication Data

US 2003/0226086 A1    Dec. 4, 2003

(51) Int. Cl.
*H03M 13/00* (2006.01)
*H03M 13/03* (2006.01)
*H03D 1/00* (2006.01)

(52) U.S. Cl. .............. 714/755; 714/758; 714/795; 375/341

(58) Field of Classification Search ............. 714/759, 714/784, 786, 746, 758, 795, 757, 755, 776; 375/341, 240.27, 262, 347
See application file for complete search history.

(56) References Cited

U.S. PATENT DOCUMENTS

| | | | |
|---|---|---|---|
| 4,763,331 A * | 8/1988 | Matsumoto ................. | 714/759 |
| 4,802,171 A * | 1/1989 | Rasky ....................... | 714/747 |
| 4,896,353 A * | 1/1990 | Dehgani et al. ............. | 714/755 |
| 5,394,440 A * | 2/1995 | Goldstein et al. ........... | 375/265 |
| 5,770,927 A * | 6/1998 | Abe .......................... | 375/340 |
| 5,838,267 A * | 11/1998 | Wang et al. ................ | 341/94 |
| 6,044,116 A * | 3/2000 | Wang ......................... | 375/265 |
| 6,141,391 A * | 10/2000 | Morelos-Zaragoza et al. ........... | 375/341 |
| 6,182,261 B1 * | 1/2001 | Haller et al. ................ | 714/758 |
| 6,185,266 B1 * | 2/2001 | Kuchi et al. ................ | 375/347 |
| 6,292,918 B1 * | 9/2001 | Sindhushayana et al. ... | 714/755 |
| 6,470,047 B1 * | 10/2002 | Kleinerman et al. ........ | 375/232 |
| 6,535,497 B1 * | 3/2003 | Raith .......................... | 370/336 |
| 6,545,990 B1 * | 4/2003 | Amalfitano et al. ......... | 370/335 |
| 6,557,139 B2 * | 4/2003 | Bohnke ....................... | 714/758 |
| 6,622,277 B1 * | 9/2003 | Ramanujam et al. ....... | 714/755 |
| 6,658,605 B1 * | 12/2003 | Yoshida et al. ............. | 714/702 |
| 6,662,337 B1 * | 12/2003 | Brink .......................... | 714/792 |
| 6,731,700 B1 * | 5/2004 | Yakhnich et al. ........... | 375/341 |
| 6,795,507 B1 * | 9/2004 | Xin et al. .................... | 375/265 |
| 6,829,297 B2 * | 12/2004 | Xia et al. .................... | 375/232 |
| 6,829,313 B1 * | 12/2004 | Xu .............................. | 375/341 |
| 6,944,235 B2 * | 9/2005 | Ophir .......................... | 375/265 |
| 6,961,432 B1 * | 11/2005 | Sinha et al. ................. | 381/2 |
| 6,963,618 B2 * | 11/2005 | Citta et al. .................. | 375/262 |

(Continued)

*Primary Examiner*—Phung M. Chung

(57) ABSTRACT

The present invention provides systems and methods for correcting errors in a received frame. The present invention introduces diversity into an error detection and correction system at the receiver side by decoding a received frame using a plurality of decoding schemes. Each of these schemes are optimized for a different set of underlying assumptions. The schemes may be optimized to account for various types of noise including, not limited to, Gaussian noise and impulsive noise. The plurality of decoded frames are then validated using an outer decoder to choose a valid frame from candidate decoded frames. By including a plurality of decoders using a plurality of decoding schemes, the error detection and correction system may accurately detect and correct errors in a constantly changing environment having constantly changing noise patterns.

22 Claims, 4 Drawing Sheets

U.S. PATENT DOCUMENTS 7,200,128 B2* 4/2007 Raith .......................... 370/336
2003/0028843 A1* 2/2003 Chang et al. ............... 714/786
2004/0043751 A1* 3/2004 Amalfitano et al. ........ 455/403

* cited by examiner

SYSTEMS AND METHODS FOR CORRECTING ERRORS IN A RECEIVED FRAME

TECHNICAL FIELD

The present invention relates to the field of communications, and more particularly, systems and methods for correcting errors in a received frame.

BACKGROUND OF THE INVENTION

As the world has become more reliant on computers and information exchange, the need for reliable data transmission has become increasingly important. One key element in the exchange of information is the accurate and efficient transmission and reception of data across noisy transmission channels.

Signal processing methods implemented in practical communications systems are usually designed under the assumption that any underlying noise and interference is Gaussian. Although this assumption finds strong theoretical justification in the central limit theorem, the noise and interference patterns commonly present in modern mobile communications systems are far from Gaussian. Noise and interference generally exhibit "impulsive" behavior. In typical mobile communication systems, noise and interference sources often include: motor-vehicle ignition noise, switching noise from electromechanical equipment, thunderstorms, and heavy bursts of interference. Current signal processing systems are not designed to handle these non-Gaussian noise sources. Accordingly, these systems may perform poorly, and might even fail, in the presence of impulsive noise.

Channel noise and interference can be effectively modeled as the superposition of many small and independent effects. In practice, these effects do not always follow a Gaussian distribution. This situation appears to contradict the central limit theorem. For many years, engineers have been unable to explain this apparent contradiction. Consequently, many of the techniques developed to cope with impulsive noise were mainly ad hoc, largely based on signal clipping and filtering prior to application of a Gaussian-based technique.

Clipping the amplitude of an input signal is only effective if the amplitude of the input signal is above or below specific threshold values. These threshold values are typically determined by the limits of hardware used in a receiver in a communication system. Accordingly, the threshold values are often chosen in order to take advantage of the full dynamic range of analog to digital (A/D) converter(s) used in such a receiver. However, if impulsive noise added to the input signal does not cause the amplitude of a signal to exceed a specific threshold, clipping will not remove the noise. Additionally, even when noise does cause the signal to exceed a threshold, clipping only removes noise to the extent that the magnitude of the signal plus the noise is above the threshold. Accordingly, noise is not actually removed, though its effects are somewhat reduced.

When individual signals within a sequence are contaminated by noise, the sequence may not be properly decoded, thereby making communications difficult. In typical communication systems, decoding is used to identify potential communication errors. Additionally, decoding may be able to correct some, or even most, errors. Errors may be corrected by one of many error detection and correct schemes known to those skilled in the art. Typical coding and decoding schemes are able to correct errors by inserting controlled redundancy into a transmitted information stream. This is typically performed by adding additional bits or using an expanded channel signal set. These schemes allow a receiver to detect, and possibly correct, errors.

In its most simple form, one problem with noisy transmission environments is that, a certain percentage of the time, a transmitted '1' is received as a '0' or vice versa. There are many methods of encoding data that allow received errors to be detected or even corrected. These encoding and decoding schemes are typically optimized based on a set of underlying assumptions. Preferably, these assumptions are designed to match the conditions of a real-world communications environment. Often, systems using these schemes are designed under the assumption that the underlying noise and interference is Gaussian. When these assumptions do not match real-world conditions, the performance of these schemes may no longer be optimal. While systems which use these schemes work well a majority of the time, their performance is severely affected when conditions degrade.

One way to accommodate increased noise in a transmission channel is to build a high level of redundancy into the encoding scheme. The problem with such solutions is that adding redundancy increases the size of each transmission frame. Those skilled in the art are familiar with the tradeoffs between using highly redundant encoding schemes, which allow the detection and correction of a greater number of reception errors, and using a scheme with lower redundancy, which has a smaller frame, and thus allows a greater quantity of data to be transmitted in a given time period at the expense of being able to detect and correct few reception errors. While these solutions may be somewhat effective, the tradeoff between accuracy and speed limits optimal performance.

Another solution for reducing the effects of noise on a transmission channel is to use multiple transmission channels for each transmission. Such schemes, called diversity schemes, transmit the same data frame on multiple channels. When the data is received, each channel is checked for accuracy and a logical decision engine, or a combiner, chooses a received signal from one of the channels that is believed to be accurate. An example of a receiver system using a diversity scheme is shown in FIG. 1.

The classical goal of a system based on a diversity scheme is to provide the receiver with L versions of an information signal transmitted over independent channels. The parameter L is the diversity order of the system. There are many ways to introduce diversity into a system. Well-known examples include frequency, time and space diversity. The RAKE receiver is a diversity technique commonly employed to combat error bursts or "deep fades" over a multipath fading channel. The basic idea is that the provisioning of multiple, independent versions of a transmitted signal greatly reduces the impact of fading. One weak signal can be compensated by other strong signals. Hence, diversity addresses the issue of robust error performance in a fading environment.

There are several well-known methods used to combine the L diversity versions of a signal that reach a receiver. The most fundamental combining techniques include selection combining, equal-gain combining, and maximal-ratio combining.

These schemes may be successful in reducing the effects of noise because it is unlikely that all of the channels will be simultaneously corrupted by noise. However, the overhead (i.e., cost of additional hardware) associated with such a scheme is large because the system utilizes multiple transmitters, receivers, and broadcast channels. The use of multiple broadcast channels is also undesirable because it requires significantly more bandwidth than normal broadcast schemes.

Therefore, there is a need in the art for systems and methods for accurately and efficiently encoding and decoding transmission signals in varying transmission conditions.

SUMMARY OF THE INVENTION

The present invention overcomes the limitations of the existing technology by providing systems and methods for correcting errors in a received frame. The systems utilize a plurality of inner decoders for decoding a received frame to form a plurality of inner decoded received frames, wherein each of the plurality of inner decoders uses a different decoding scheme. Additionally, the systems use an outer decoder unit for decoding each inner decoded received frame to form outer decoded received frames and for selecting an outer decoded received frame to use as an output frame.

The present invention introduces diversity into an error detection and correction system at the receiver side by decoding a received frame using a plurality of decoding schemes. Each of these schemes are optimized for a different set of underlying assumptions. The schemes may be optimized to account for various types of noise including, but not limited to, Gaussian noise and impulsive noise. By including a plurality of decoders using a plurality of decoding schemes, the error detection and correction system may accurately detect and correct errors in a constantly changing environment having constantly changing noise patterns.

Other objects, features, and advantages of the present invention will become apparent upon reading the following detailed description of the embodiments of the invention, when taken in conjunction with the accompanying drawings and appended claims.

DETAILED DESCRIPTION

Figure 1:
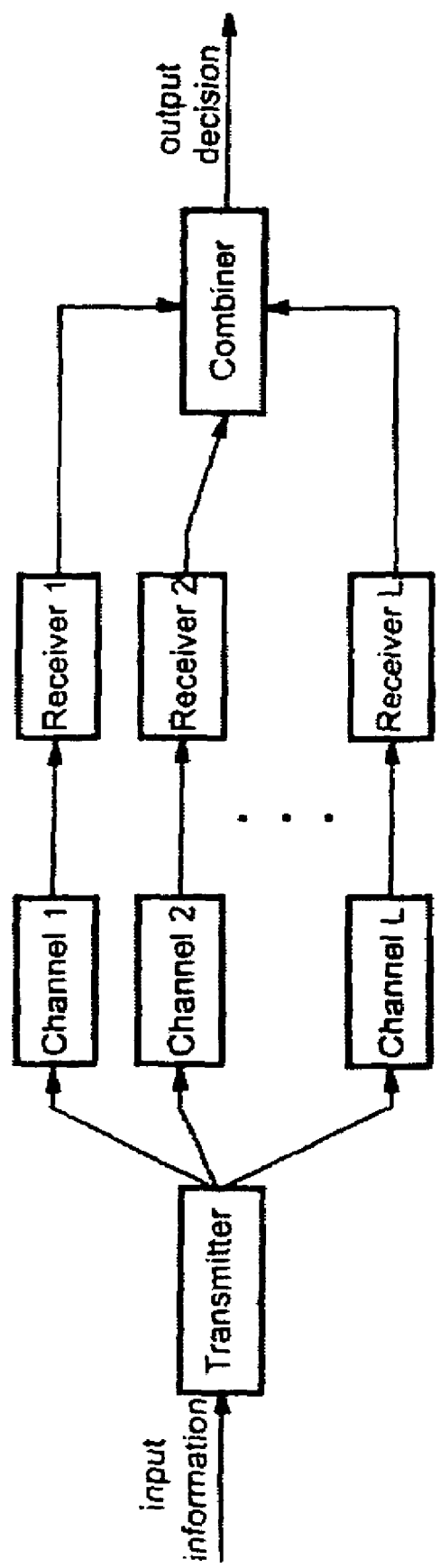
FIG. 1 is a block diagram illustrating a diversity transmission structure.

Referring now to the drawings, in which like numerals refer to like techniques throughout the several views, exemplary embodiments of the present invention are shown.

The techniques of the present invention were developed after realizing that the conditions needed to validate the central limit theorem are not satisfied if the variance of "small and independent effects" is allowed to be unbounded (from a conceptual perspective, an infinite variance describes a highly dispersed or impulsive random variable). Without a finite variance constraint, a converging sum of normalized random variables can be proven to belong to a wider class of random variables known as "$\alpha$-stable". Thus, similar to Gaussian processes, $\alpha$-stable processes can appear in practice as the result of physical principles. Furthermore, all non-Gaussian Ix-stable processes are heavy-tailed processes with infinite variance, explaining the often found impulsive nature of practical signals.

"Symmetric" $\alpha$-stable random variables possess a characteristic function of the form:

$$\Phi(\omega) = e^{-\gamma|\omega|^\alpha} \tag{1}$$

where $\alpha$ is called the index or characteristic exponent, and $\gamma$ is the dispersion. Analogous to the variance in a Gaussian process, $\gamma$ is a measure of the signal strength. The shape of the distribution is determined by $\alpha$. From the above equation, it can be proven that $\alpha$ is restricted to values in the interval (0,2]. Qualitatively, smaller values of $\alpha$ correspond to more impulsive distributions. The limiting case of $\alpha=2$ corresponds to the Gaussian distribution. This is the least impulsive $\alpha$-stable distribution, and the only one with finite variance. A value of $\alpha=1$ results in a random variable with a Cauchy distribution, which is a heavy-tailed distribution.

An estimation theory in $\alpha$-stable environments can be derived from the tools of robust statistics. In general, let $\rho(x)$ be a symmetric cost function or metric which is monotonically non-decreasing on $[0,\infty)$. For a set of samples $x_1$, $x_2, \ldots, x_N$, the M-estimator of the location parameter, $\beta$, is defined as $$\beta = \arg\min_\beta \sum_{i=1}^{N} \rho(x_i - \beta). \tag{2}$$

In the theory of M-estimators, the shape of the cost function, $\rho$, determines the characteristics of the estimate, $\beta$. For example, if $\rho(x)=x^2$ (i.e. the Euclidean metric), $\beta$ becomes the least-squares estimate (i.e. the sample mean). For $\rho(x)=|x|$, $\beta$ is the sample median. It may be shown that the cost function $$\rho(x) = \log(k^2 + x^2), \tag{3}$$

where k is a constant, possesses important properties for optimizing decoder performance along the whole range of $\alpha$-stable distributions. The importance of the cost function described in equation (3) is that the value of k may be tuned to give optimal estimation performance depending on the parameters of the underlying distribution. Given the parameters $\alpha$ and $\gamma$ of an $\alpha$-stable distribution generating an independently and identically distributed (i.i.d.) sample, the optimal value of k is given by a function of the form:

$$k(\alpha, \gamma) = k(\alpha)\gamma^{1/\alpha} \tag{4}$$

Expression (4) indicates a "separability" property of the optimal value of k in terms of the parameters $\alpha$ and $\gamma$. This reduces the problem of finding the functional form of $k(\alpha, \gamma)$ to that of determining the simpler form:

$$k(\alpha) = k(\alpha, 1), \quad 0 < \alpha \leq 2. \tag{5}$$

This function may be referred to as "the $\alpha$-k plot" of $\alpha$-stable distributions. Under the maximum likelihood optimality criterion, the $\alpha$-k plot touches three fundamental points:

1. For $\alpha=2$ (i.e. the Gaussian distribution), the optimal value of k is $k=\infty$, which, for the location estimation problem, makes $\beta$ equal to the sample mean.
2. With $\alpha=1$ (i.e. the Cauchy distribution), the optimal value is $k=1$. This is a direct consequence of the definition of the cost function in Equation (3), and the fact that the resulting M-estimator is equivalent to the maximum likelihood estimator for a Cauchy distribution.
3. When $\alpha \to 0$ (i.e. the most impulsive distribution), the optimal value of k converges to $k=0$.

Figure 2:
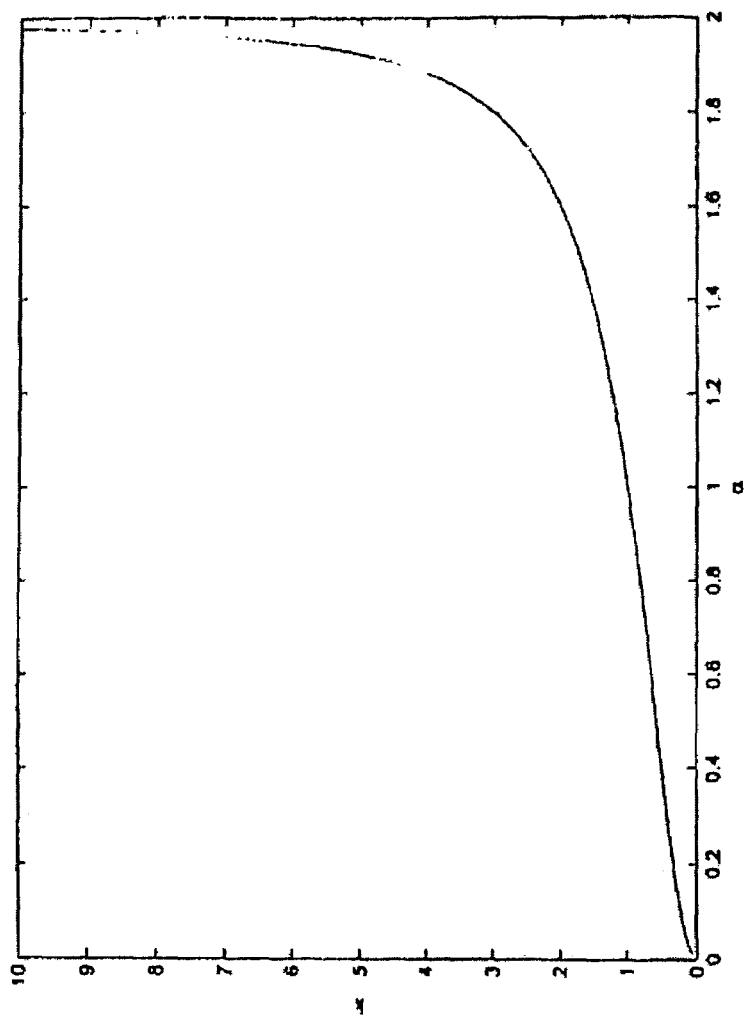
FIG. 2 is an illustration of an $\alpha$-k plot.

The above points suggest the general shape of the $\alpha$-k plot illustrated in FIG. 2.

One general goal of using encoding and decoding for the transmission of data is to minimize the probability of error.

In the situation where coded sequences are equally likely, this is accomplished using a "maximum likelihood" decoder.

For hard decision decoding, it is well known that a maximum likelihood decoder selects the codeword that is closest in Hamming distance to the received sequence.

It is also well known that soft decision decoding offers a performance advantage over hard decision decoding. Soft decision decoding preserves information contained in the received sequence and passes that information on to a decoding scheme. The task is to choose a cost function appropriate for soft decision decoding. For a channel with underlying noise and interference that is Gaussian, maximum likelihood decoding is achieved using a Euclidean distance cost function. However, for a channel that is not Gaussian, the choice of an appropriate cost function is not trivial and may have a significant impact on decoder performance.

The present invention introduces diversity into baseband detection and/or decoding of received information frames. In an exemplary embodiment of the present invention, different decoding schemes are used to decode transmitted signals on channels that exhibit some degree of impulsiveness.

There are many systems that employ an outer code, usually a cyclic redundancy check (CRC) code, for the purpose of frame error detection (e.g. IS-95, List Viterbi Algorithm). A received frame that passes the CRC check is accepted as containing no errors. Typically, a frame that fails the CRC check is discarded. In some systems, a retransmission request is issued when the frame fails the CRC check. In an exemplary embodiment of the present invention, the outer CRC code is used to validate different "candidate" frames. Each candidate frame is generated using a different baseband detection and/or decoding method. Hence, diversity is introduced into the system through the use of various detection and/or decoding techniques. The CRC code is a form of selection combining since the CRC determines which, if any, of the candidate frames is accepted as the final estimate of a transmitted frame. If all L candidates fail the CRC, all candidates may be discarded.

Under the assumption that the CRC code is perfect (i.e. there are no undetected errors), it is easy to see that baseband diversity with L>1 (i.e. L different methods of detection and/or decoding) exhibits performance no worse than L=1 using any one particular method of detection and/or decoding.

Figure 3:
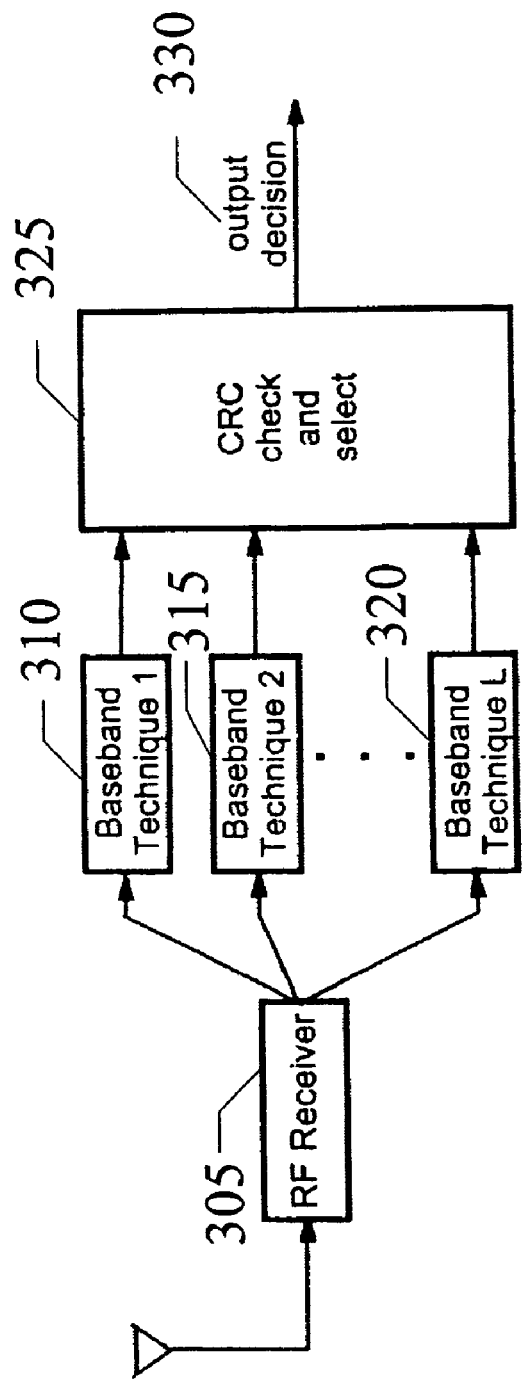
FIG. 3 is a block diagram illustrating a system for correcting errors in a received frame in accordance with an exemplary embodiment of the present invention.

FIG. 3 is a block diagram of a system for correcting errors in a received frame according to an exemplary embodiment of the present invention. An RF receiver 305 receives a signal over an RF channel and distributes the received signal to a plurality of decoders 310, 315, 320. Each of the decoders uses a different baseband decoding technique. In an exemplary embodiment of the present invention, one decoder is optimized for Gaussian noise, and one or more decoders are optimized for non-Gaussian noise. Typically, it is preferable for the decoders optimized for non-Gaussian noise to be optimized for impulsive noise. Each decoder 310, 315, 320 outputs a decoded output signal to a CRC check and select unit 325. The CRC check and select unit 325 performs a CRC check on the outputs from the decoders 310, 315, 320 and selects a decoded output signal that passes the CRC check. The selected decoded output signal is sent from the CRC check and select unit as an output decision 330.

Figure 4:
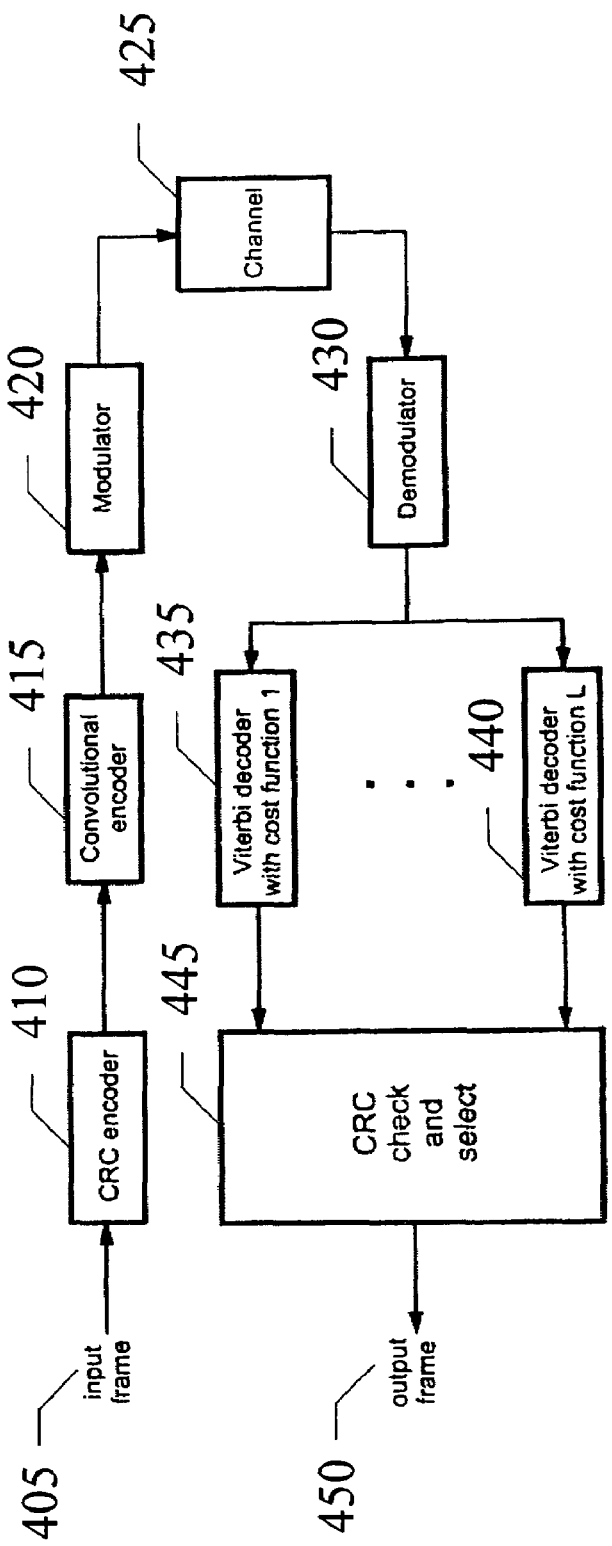
FIG. 4 is a block diagram illustrating a system for correcting errors in a received frame using a Viterbi algorithm in accordance with an exemplary embodiment of the present invention.

FIG. 4 is a block diagram of a system for correcting errors in a received frame which uses a Viterbi algorithm according to an exemplary embodiment of the present invention. The system shown in FIG. 4 is designed for a communications channel with background noise that is potentially impulsive (e.g., mobile communications system). The channel coding system 410, 415 utilizes an outer CRC code and an inner convolutional code. An input frame 405 is fed to a CRC encoder 410 for CRC encoding. Any suitable error detection or error detection/correction encoder may be used in place of the CRC encoder 410. This first step of encoding may be referred to as outer error detection encoding. In reference to the various embodiments of the present invention, outer error detection encoding and decoding may refer to CRC encoding, parity check encoding, or any other suitable error detection or error detection/correction scheme.

In an exemplary embodiment of the present invention, the CRC encoder 410 feeds the outer encoded input frame to a convolutional encoder 415. The present invention is operable using any decoding scheme that can be used for decoding a frame, including, but not limited to, Viterbi codes, Turbo codes, block codes, LDPC codes, Reed-Solomon codes, etc. The convolutional encoder 415 performs a second level of encoding to the input frame. This second level of encoding may be referred to as the inner error detection/correction scheme. It should be understood that while the embodiment described above used a convolutional code, any inner code may be used.

Once the input frame is encoded by both the inner error detection/correction scheme and the outer error detection scheme, it is transmitted to a desired destination. The present invention is not concerned with the actual transmission of data, but rather the detection and correction of errors incurred during transmission. In a typical data transmission system, the input frame is modulated by a modulator 420, transmitted over a transmission channel 425, and demodulated by a demodulator 430 once it is received at a destination.

After receipt of the transmitted frame at the destination, the received frame is decoded. In accordance with the present invention, the received frame is first decoded using multiple decoding schemes associated with the inner decoding scheme. In an exemplary embodiment of the present invention, a plurality of Viterbi decoders 435, 440 are used. Each Viterbi decoder 435, 440 uses a different cost function. The use of various cost (i.e. metric) functions within the Viterbi decoding unit 435, 440 for the inner convolutional code, introduces diversity into the system. For example, L cost functions may be described by:

$$\rho_i(x) = \log(k_i^2 + x^2), \, i=1,2\ldots L, \quad (6)$$

where the constant $k_i$ is optimized for a particular level of impulsivity (i.e., a particular value of $\alpha$). We refer to this system as having "metric diversity."

As a simple example, and without limitation, consider L=2. A designer may choose $k_1$ to be optimized for a channel with no impulsivity (i.e., Gaussian noise) and $k_2$ for a channel with extreme impulsivity. These two extremes are represented by $\alpha=2$ and $\alpha=0$, respectively. Accordingly, the optimal values of k are $k_1=\infty$ and $k_2=0$.

In an exemplary embodiment of the present invention, various decoding schemes are selected to accommodate the various noise profiles that may be encountered. As in the example above, it is generally desirable, but not critical, to select at least one decoding scheme optimized for a channel with no impulsivity (i.e., Gaussian noise) and at least one decoding scheme optimized for a channel with impulsivity. Additionally, depending on available resources and other considerations, it may be desirable to include a plurality of decoders optimized for channels having a variety of impulsiveness. For example, the decoders may be optimized ranging across the spectrum of $\alpha=2$ to $\alpha=0$. Such a scheme using multiple decoders, greatly increases the odds of correcting errors incurred in a frame due to noise in the transmission channel.

After the decoders 435, 440 decode the transmitted frame, the results are fed to an outer error check/frame select unit 445. In an exemplary embodiment of the present invention, the outer error check/frame selection unit 445 performs a CRC check and selects the results of an inner decoder that passes the CRC check. The selected frame is then outputted as the output frame 450. Any selection routine may be used. A simple selection routine includes sequentially checking the results of each inner decoder 435, 440 and selecting the first decoder which passes the CRC check. Alternatively, all decoders 435, 440 may be checked and compared to assure that all frames passing the CRC check contain the same message. It is highly unlikely that multiple decoded frames will pass the CRC check but contain different messages, however this alternative technique may be desirable in systems where a low level error detection scheme, such as parity check, is used for the outer error detection scheme.

While this invention has been described in detail with reference to embodiments thereof, it will be understood that variations and modifications can be effected without departing from the spirit or scope of the present invention as defined by the claims that follow.

What is claimed is:

1. A system comprising:
   a plurality of inner decoders, each for decoding an encoded received frame to form a plurality of inner decoded received frames, wherein each of the plurality of inner decoders uses a different, decoding scheme;
   an outer decoder unit, coupled to each of said inner decoders, for decoding each inner decoded received frame to form outer decoded received frames; and
   a selection unit, coupled to said outer decoder unit for selecting an outer decoded received frame to use as an output frame.

2. The system of claim 1, wherein said outer decoder is an error detection decoder.

3. The system of claim 1, wherein said outer decoder is an error detection/correction decoder.

4. The system of claim 1, wherein each of the plurality of inner decoders is an error detection/correction decoder.

5. The system of claim 1, wherein the plurality of inner decoders is adapted to use a cost function:

$$\rho_i(x) = \log(k_i^2 + x^2).$$

6. The system of claim 5, wherein the values of $k_i$ are optimized according to noise characteristics as a metric function for an i-th decoder.

7. The system of claim 1, wherein each decoding scheme is optimized for different noise characteristics.

8. The system of claim 7, wherein at least one of said plurality of inner decoders implements a decoding scheme optimized for Gaussian noise.

9. The system of claim 7, wherein at least one of said plurality of inner decoders implements a decoding scheme optimized for impulsive noise.

10. The system of claim 1, wherein the plurality of inner decoders have metric diversity.

11. A method comprising the steps of:
    decoding a received frame using a plurality of inner decoders to form a plurality of inner decoded received frames, wherein each of the plurality of inner decoders uses a different decoding scheme;
    decoding a plurality of inner decoded received frames using an outer decoder unit, coupled to each of said inner decoders, to form a plurality of outer decoded received frames; and
    selecting an outer decoded received frame from the plurality of outer decoded received frames to use as an output frame.

12. The method of claim 11, wherein the step of selecting an outer decoded received frame comprises the steps of:
    verifying a checksum for a first outer decoded received frame of the plurality of outer decoded received frames; and
    selecting the first outer decoded received frame if the checksum is correct.

13. The method of claim 11, wherein the step of decoding the plurality of outer decoded received frames comprises verifying that the frames were received without errors.

14. The method of claim 11, wherein the step of decoding the plurality of outer decoded received frames is performed using a CRC check.

15. The method of claim 11, wherein at least one of the decoding schemes for the plurality of inner decoders is optimized for Gaussian noise.

16. The method of claim 11, wherein at least one of the decoding schemes for the plurality of inner decoders is optimized for impulsive noise.

17. The method of claim 11, wherein the decoding schemes for the plurality of inner decoders uses cost functions according to an equation $$\rho_i(x) = \log(k_i^2 + x^2).$$

18. The method of claim 17, wherein the values of $k_i$ are optimized according to noise characteristics as a metric function for an i-th decoder.

19. The method of claim 11, wherein said outer decoder is an error detection decoder.

20. The method of claim 11, wherein said outer decoder is an error detection/correction decoder.

21. A system comprising:
    a plurality of inner decoders, each for decoding an encoded received frame to form a plurality of inner decoded received frames, wherein each of the plurality of inner decoders uses a different decoding scheme and a different cost function;
    an outer decoder unit, coupled to each of said inner decoders, for decoding each inner decoded received frame to form outer decoded received frames; and
    a selection units coupled to said outer decoder unit, for selecting an outer decoded received frame to use as an output frame.

22. A method comprising the steps of:
    decoding a received frame using a plurality of inner decoders to form a plurality of inner decoded received frames, wherein each of the plurality of inner decoders uses a different decoding scheme and different cost function;
    decoding a plurality of inner decoded received frames using an outer decoder unit, coupled to each of said inner decoders, to form a plurality of outer decoded received frames; and
    selecting an outer decoded received frame from the plurality of outer decoded received frames to use as an output frame.

* * * * *